US011101802B2

(12) United States Patent
Choi

(10) Patent No.: US 11,101,802 B2
(45) Date of Patent: *Aug. 24, 2021

(54) APPARATUSES AND METHODS FOR TRANSMITTING AN OPERATION MODE WITH A CLOCK

(71) Applicant: Micron Technology, Inc., Boise, ID (US)

(72) Inventor: Jung-Hwa Choi, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/815,259

(22) Filed: Mar. 11, 2020

(65) Prior Publication Data

US 2020/0287547 A1  Sep. 10, 2020

Related U.S. Application Data

(63) Continuation of application No. 16/292,074, filed on Mar. 4, 2019, now Pat. No. 10,630,294.

(51) Int. Cl.
  *H03K 19/096* (2006.01)
  *H03B 5/12* (2006.01)
  *G06F 9/30* (2018.01)
  *G06F 1/10* (2006.01)

(52) U.S. Cl.
  CPC ........... *H03K 19/0966* (2013.01); *G06F 1/10* (2013.01); *G06F 9/30003* (2013.01); *H03B 5/1271* (2013.01)

(58) Field of Classification Search
  CPC .............. H03K 19/0966; H03B 5/1271; G06F 9/30003; G06F 1/10
  See application file for complete search history.

(56) References Cited

U.S. PATENT DOCUMENTS

| 10,163,486 | B1* | 12/2018 | Gajapathy | G11C 11/408 |
| 10,504,571 | B1* | 12/2019 | Johnson | G11C 7/109 |
| 10,630,294 | B1* | 4/2020 | Choi | G06F 1/10 |
| 2007/0074059 | A1* | 3/2007 | Abernathy | G06F 9/3867 713/500 |
| 2019/0052268 | A1* | 2/2019 | Lee | G11C 7/1057 |

OTHER PUBLICATIONS

U.S. Appl. No. 16/292,074 titled "Apparatuses and Methods for Transmitting an Operation Mode with a Clock" filed Mar. 4, 2019; pp. all.

* cited by examiner

*Primary Examiner* — Seokjin Kim
(74) *Attorney, Agent, or Firm* — Dorsey & Whitney LLP

(57) ABSTRACT

Apparatuses and methods for transmitting a command mode (e.g., operation mode) associated with a command between devices are disclosed. One device may be configured as a master and one or more devices may be configured as slaves. The command mode may be transmitted by the master to the slaves by setting a resting state of a clock signal transmitted between the devices and transitioning a device enable signal to an active state. The slaves may detect the resting state of the clock at the time the enable signal is transitioned to the active state in order to determine the command mode of the command. The devices may then execute the command in the mode indicated by the transmitted command mode.

15 Claims, 8 Drawing Sheets

APPARATUSES AND METHODS FOR TRANSMITTING AN OPERATION MODE WITH A CLOCK

CROSS REFERENCE TO RELATED APPLICATION(S)

This application is a continuation of U.S. patent application Ser. No. 16/292,074 filed Mar. 4, 2019 and issued as U.S. Pat. No. 10,630,294 on Apr. 21, 2020. The aforementioned application, and issued patent, is incorporated herein by reference, in its entirety, for any purpose.

BACKGROUND

Semiconductor devices such as microcomputers, memories, gate arrays, among others, may include components on multiple die. Signals (e.g., data, commands) may be provided to and/or between one or more die. In some devices, one die may act as a master die and the remaining die may act as slave die. The master die may provide signals to control the operations of the slave die. In some devices, only the master die may receive certain commands or signals from an external device, for example, a memory controller. This arrangement may reduce the number of conductive lines required between the external device and the device.

The master die may transmit signals to the slave die via one or more conductive lines. As the number of die of the device and variety of signals increase, the number of conductive lines may also increase. Conductive lines for transmitting signals between die may take up additional layout space for the device as well as require additional input/output pads on the die. Accordingly, it is desirable to use conductive lines to transmit multiple signal types to save layout and pad area in devices and simplify package design.

DETAILED DESCRIPTION

Figure 1:
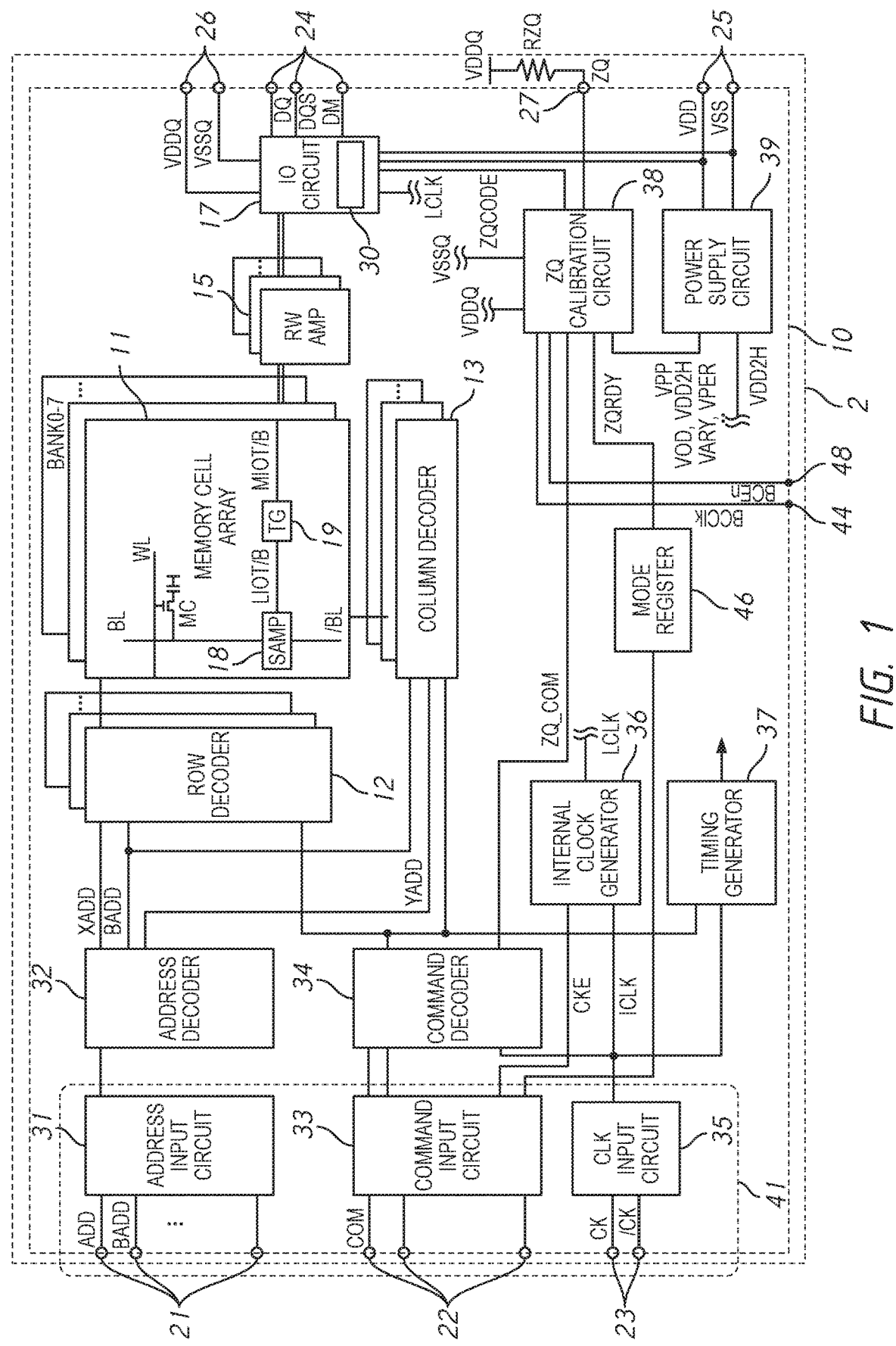
FIG. 1 is a block diagram of a semiconductor device according to an embodiment of the disclosure.

Certain details are set forth below to provide a sufficient understanding of embodiments of the disclosure. However, it will be clear to one skilled in the art that embodiments of the disclosure may be practiced without these particular details. Moreover, the particular embodiments of the disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure.

A device, such as semiconductor device, may include multiple devices (e.g. devices located on individual die) that work in a coordinated manner in order to execute operations of the overall device. For example, the device may include an oscillator for generating a clock signal or may receive an external clock for synchronizing operations. The device may utilize an enable signal to enable or disable various devices located on different die of the device. The enable signal may control which devices perform an operation. In addition to clock and enable signals, the device may utilize other signals to transmit other information for proper execution of operations such as data, commands, and operation modes. The signals may be transmitted to die via conductive lines. Each type of signal (e.g., data, clock, command) may be transmitted on a separate conductive line. However, as the number of types of signals increases and the number of die in the device increases, the number of conductive lines required to transmit each type of signal on its own conductive line may be prohibitive due to size constraints of the device.

In some devices, certain devices may be configured as "master" devices whereas other devices are configured as "slave" devices. For example, in a memory device, one or more devices in the memory may be configured as a master device, and each master device may be coupled to one or more devices configured as slave devices. A master device may control operations of its slave devices via transmission of signals between the master and slaves. While configuring devices as master and slave die may reduce a number of conductive lines for transmitting signals to the devices of the overall device and/or between devices configured as slave components, numerous conductive lines may be necessary for transmitting signals between the master device and slave devices.

To reduce the number of conductive lines, some signals may share the same conductive lines as long as the components are able to differentiate what type of signal is being transmitted on the conductive line. For example, in a typical memory device, read data and write data may share an I/O line because a read command and a write command are not executed at the same time. However, other signal types may not be able to be separated by time and/or command types. For example, certain commands may be associated with multiple modes of operation (e.g., a command mode). The command may be executed in a different manner depending on the mode. For example, a command may be executed in a different number of clock cycles, use a different clock frequency, and/or execution of the command is triggered by a different event based on the mode associated with the command. While the command and the mode could be transmitted sequentially on the same conductive line, this would require delaying execution of the command. Thus, it would be advantageous to transmit the command mode between devices (e.g., between a master and slaves) on an existing conductive line at substantially the same time the command is transmitted between components.

In an embodiment the present disclosure, a command mode may be transmitted by setting a resting state of a dock and transitioning an enable signal to an active state. The resting state of the clock when the enable signal is transitioned to the active state may indicate the operation mode of a command to be executed.

In the examples described herein, a calibration command associated with two or more operation modes in a memory device is disclosed. However, this is for illustrative purposes only and the principles of the present disclosure are not limited to the disclosed examples.

FIG. 1 is a block diagram of a semiconductor device 10 according to an embodiment of the disclosure. The semiconductor device 10 may be a memory (e.g., LPDDR5 SDRAM) integrated into a single semiconductor chip, for example. The semiconductor device 10 may be mounted on an external substrate 2, for example, a memory module substrate, a mother board or the like. The external substrate 2 employs an external resistance RZQ that is coupled to a calibration terminal ZQ 27 of the semiconductor device 10. The external resistance RZQ is a reference impedance used by impedance (ZQ) calibration circuit 38. In some embodiments, such as the one shown in FIG. 1, the external resistance RZQ, which may also be referred to as an external ZQ resistor, is coupled to a power supply voltage VDDQ.

As shown in FIG. 1, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the hit line BL is performed by a column decoder 13. Sense amplifiers 18 are coupled to corresponding bit lines BL and coupled to local I/O line pairs LIOT/B. Local IO line pairs LIOT/B are coupled to main IO line pairs MIOT/B via transfer gates TG 19 which function as switches.

Turning to the explanation of a plurality of external terminals included in the semiconductor device 10, the plurality of external terminals includes address terminals 21, command terminals 22, clock terminals 23, data terminals 24, power supply terminals 25 and 26, and the calibration terminal ZQ 27. An input signal block 41 may include the address terminals 21, the command terminals 22 and the clock terminals 23. A data interface block 42 includes the data terminals 24. The data terminals 24 may be coupled to output buffers for read operations of memories. Alternatively, the data terminals 24 may be coupled to input buffers for read/write access of the memories that will be later described. FIG. 1 shows an example of dynamic random access memory (DRAM), however, any device having external terminals for signal input/output may be included as the external terminals of embodiments of the disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 21 is input to a command decoder 34 via the command input circuit 33. The command decoder 34 decodes the command signal COM to generate various internal command signals. For example, the internal commands may include a row command signal to select a word line and a column command signal, such as a read command or a write command, to select a hit line, and a calibration signal ZQ_COM provided to the calibration circuit 38.

When a row activation command is issued and a bank address and a row address are timely supplied with the activation command, and a column address are timely supplied with a read command, read data is read from a memory cell MC in the memory cell array 11 designated by these row address and column address. The read data DQ is output externally from the data terminals 24 via a read/write amplifier 15 and an input/output circuit 17. Similarly, when the row activation command is issued and a bank address and a row address are timely supplied with the activation command, and a column address are timely supplied with the write command, the input/output circuit 17 may receive write data DQ at the data terminals 24. The write data DQ is supplied via the input/output circuit 17 and the read/write amplifier 15 to the memory cell array 11 and written in the memory cell MC designated by the row address and the column address. The input/output circuit 17 may include input buffers and output buffers, according to one embodiment. The input/output circuit 17 may include programmable termination circuits 30. The programmable termination circuits 30 of the input/output circuit 17 may be set to provide impedances of the input buffer and output buffer of the input/output circuit 17. The impedance of the programmable termination components may be used to reduce impedance mismatch.

The clock terminals 23 are supplied with external clock signals CK and /CK, respectively. These external clock signals CK and /CK are complementary to each other and are supplied to a clock input circuit 35. The clock input circuit 35 receives the external clock signals CK and /CK and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and is used as a timing signal for determining an output timing of the read data DQ. The internal clock signal ICLK is also supplied to a timing generator 37 and thus various internal clock signals can be generated.

A mode register 46 is used to define various modes of programmable operations and configurations of the semiconductor device 10. The mode register retains the stored information until it is reprogrammed, reset, or the semiconductor device 10 loses power. The mode register 46 is programmed via a mode register write command. The mode register 46 may include one or more registers for storing information related to the different operations and configurations. For example, the mode register may be used to set burst length, burst type, CAS latency, frequency set point, enable programmable termination components, as well as others. The mode register 46 may also be programmed with information that can be read to provide status information about the semiconductor device 10. For example, the mode register may be used to provide a ready status, calibration status, as well as other status information. The information that is read may be programmed by circuits of the semiconductor device 10. The mode register 46 may be read via a mode register read command. Reading the mode register 46 allows information about the status of operations and configurations to be provided by the semiconductor device 10.

The power supply terminals 25 are supplied with power supply voltages VDD and VSS. These power supply voltages VDD and VSS are supplied to an internal power supply circuit 39. The internal power supply circuit 39 generates various internal voltages VPP, VOD, VARY, VPERI, and Vdd2H. The Vdd2H voltage may be an internal voltage used as an output voltage to drive output signals. The internal voltage VPP is mainly used in the row decoder 12, the internal voltages VOD and VARY are mainly used in the sense amplifiers 18 included in the memory cell array 11, and the internal voltage VPERI is used in many other circuit blocks. A reference voltage ZQVREF is generated by the calibration circuit 38 in some embodiments. In some embodiments, the ZQVREF is based on the VDDQ voltage.

The power supply terminals 26 are supplied with power supply voltages VDDQ and VSSQ. These power supply voltages VDDQ and VSSQ are supplied to the input/output circuit 17. The power supply voltages VDDQ and VSSQ may be the same voltages as the power supply voltages VDU and VSS that are supplied to the power supply terminals 25, respectively. However, the dedicated power supply voltages VDDQ and VSSQ may be used for the input/output circuit 17 so that power supply noise generated by the input/output circuit 17 does not propagate to the other circuit blocks. In some embodiments, VDDQ and VSSQ may be provided to calibration circuit 38.

The power supply voltage VDDQ may change during operation. For example, the power supply voltage VDDQ may change from a relatively low voltage (e.g., 0.3 volts) to a relatively high voltage (e.g., 0.5 volts), and vice versa. The power supply voltage VDDQ may be changed when a frequency set point of the semiconductor device 10 is changed. Changing frequency set point for the semiconductor device 10 changes the frequency of operation, for example, the operating speed of the input/output circuits 17. Lower frequencies of operation may operate without the use of on-die terminations, while higher frequencies of operation may require using on-die terminations to mitigate impedance mismatch. Lower voltages may be used for lower frequencies of operation due to reduced voltage swing from being unterminated, whereas higher voltages are used for higher frequencies of operation. For example, when switching from a relatively low frequency set point to a higher frequency set point the power supply voltage VDDQ may change from relatively low voltage to a higher power supply voltage VDDQ. Conversely, when switching from a relatively high frequency set point to a lower frequency set point the power supply voltage VDDQ may change from relatively high voltage to a lower power supply voltage VDDQ. In some examples, external resistance RZQ is connected to the power supply voltage VDDQ.

The calibration circuit 38 include circuits to perform calibration operations when activated by the calibration signal ZQ_COM. The calibration operations may be performed with reference to an impedance of an external resistance RZQ and the reference voltage ZQVREF. The calibration circuit 38 is coupled to the calibration terminal ZQ 27. In embodiments where a plurality of semiconductor devices 10 have respective calibration terminals ZQ 27 coupled to an external resistance RZQ, the calibration circuit 38 arbitrates amongst the plurality of semiconductor devices 10 for use of the external resistance RZQ during calibrations operations. During a calibration operation, the calibration circuit 38 calibrate impedances of programmable termination components to the external resistance RZQ by determining appropriate calibration parameters that are used to set an impedance of the programmable termination circuits 30. The calibration parameters determined by the calibration circuit 38 during the calibration operation may be stored by the calibration circuit 38. The stored calibration parameters may be retrieved and applied to the programmable termination circuits 30. An impedance code ZQCODE representing calibration parameters is supplied to the input/output circuit 17 to set the programmable termination components to the desired impedance for the buffers of the input/output circuit 17. The calibration circuit 38 programs calibration information ZQRDY into the mode register 46. The calibration information ZQRDY reflects an aspect of the calibration operation. The mode register 46 may be queried, for example, by a memory controller, to retrieve the calibration information reflecting an aspect of the calibration operation. An example calibration operation and the mode register 46 may be found in U.S. Patent Application Publication 2018/0167055 which is incorporated herein by reference for any purpose.

The ZQ_COM signal may include a calibration command ZQCal and a command mode ZQMode. The command mode may determine the type of calibration operation performed by the calibration circuit 38. For example, calibration circuit 38 may perform a first type of calibration (e.g., background calibration) responsive to a command mode signal in a first state (e.g., ZQMode=0) and perform a second type of calibration (e.g., command-based calibration) responsive to a command mode signal in a second state (e.g., ZQMode=1). The command mode may indicate one or more differences in the manner in which the command is executed. For example, the command mode may indicate a number of clock cycles in which the calibration is to be executed, the frequency of a clock signal used for the calibration, and/or when execution of the calibration should be initiated.

According to the principles of the present disclosure, semiconductor device 10 may be configured as a master device or as a slave device. In some embodiments, semiconductor device 10 may be configured to provide a master signal ZQMaster (not shown) to calibration circuit 38. In some embodiments, the master signal ZQMaster may be programmed into the mode register 46. In some embodiments, the mode register 46 may be programmed based on commands provided by an external device (e.g., memory controller). Semiconductor device 10 may be configured as a master when the master signal is in a first state (e.g., ZQMaster=1) and configured as a slave when the master signal is in a second state (e.g., ZQMaster=0). In other embodiments, semiconductor device 10 may be configured as a master device or a slave device by setting a fuse or antifuse (not shown in FIG. 1. In both embodiments, semiconductor device 10 may include the same circuitry whether configured as a master or a slave. However, the master signal or fuse may disable slave circuitry when semiconductor device 10 is configured as a master and disable master circuitry when semiconductor device 10 is configured as a slave.

Still referring to FIG. 1, calibration circuit 38 may be coupled to backchannel clock signal line 44 and backchannel enable signal line 48 to provide or receive backchannel clock BCClk and backchannel enable BCEn signals, respectively. When semiconductor device 10 is configured as a master, calibration circuit 38 may transmit the backchannel clock and back channel enable signals to slave devices (not shown in FIG. 1). When semiconductor device 10 is configured as a slave, calibration circuit 38 may receive the backchannel clock and back channel enable signals from a master device (not shown in FIG. 1) and will not receive and/or respond to commands from ZQ_COM. As will be described in more detail below, when semiconductor device 10 is configured as a master, calibration circuit 38 may set a resting state of the backchannel clock signal based on a state of the ZQMode signal. When semiconductor device 10 is configured as a slave, calibration circuit 38 may use the resting state of the background clock signal when the backchannel enable signal is transitioned to an active state in order to determine the mode of the calibration command to execute. As used herein, a backchannel may refer to one or more conductive lines used to transmit signals between master and slave devices.

As previously mentioned, the command mode may indicate a number of clock cycles in which the calibration is to be executed, the frequency of a clock signal used for the calibration, and/or when execution of the calibration should be initiated. The calibration circuits 38 of the master device and slave device(s) may have to make a self-adjustment in response to the number of clock cycles and/or frequency of the clock during execution of the calibration operation. For example, the calibration circuits 38 may need to adjust coupling of a low pass filter coupled to input nodes of a comparator in the calibration circuit and/or change logic to match the frequency of the clock and/or period of time for the calibration operation. Thus, transmitting the command mode may allow both master devices and slave device(s) to be configured appropriately for the execution of a command in the indicated command mode.

Figure 2:
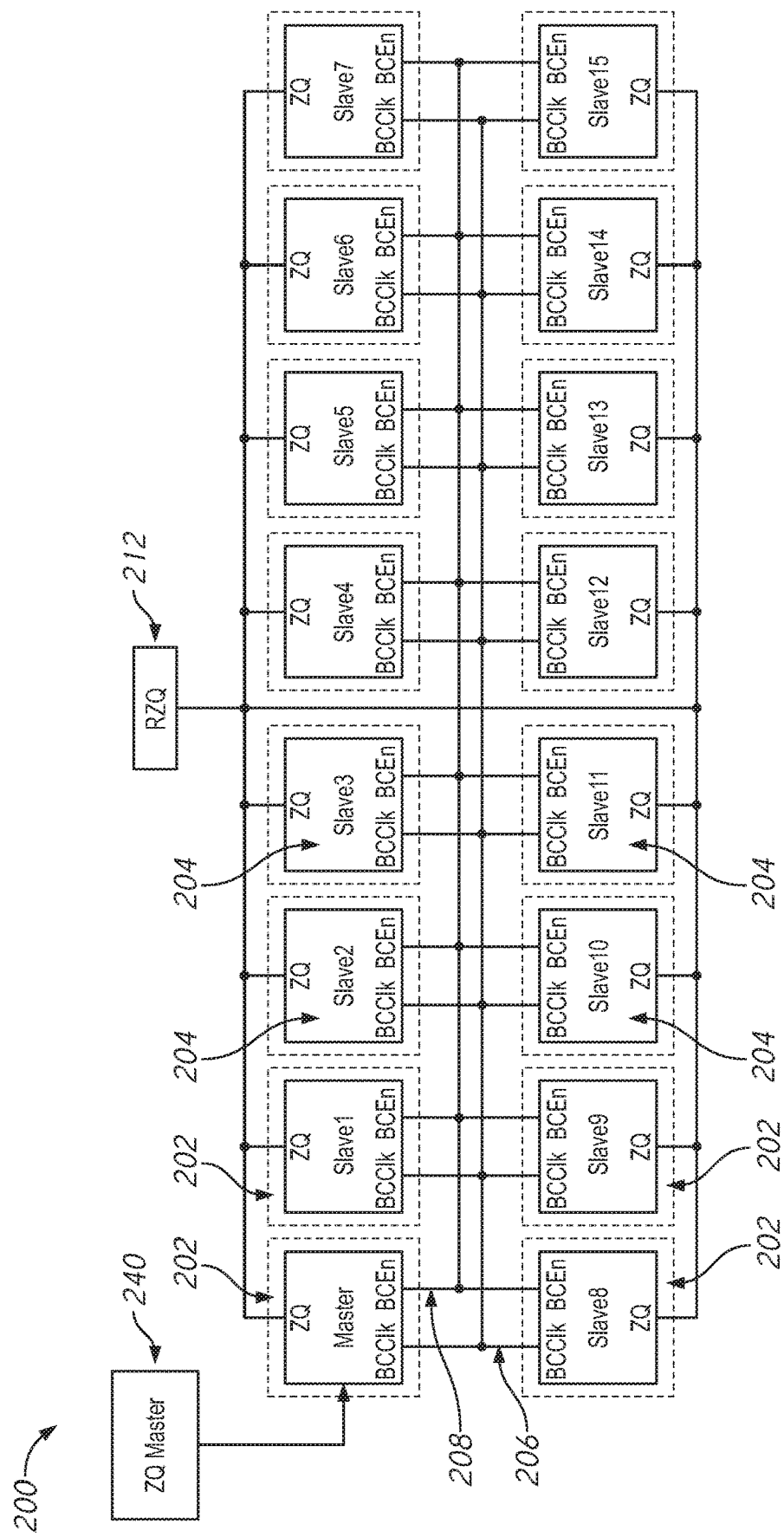
FIG. 2 is a block diagram of at least a portion of a semiconductor device according to an embodiment of the disclosure.

FIG. 2 is a block diagram of at least a portion of a semiconductor device 200 according to an embodiment of the disclosure. The semiconductor device 200 may be a volatile memory such as a SRAM or DRAM, or a non-volatile memory such as a FLASH memory or a ferroelectric memory in some embodiments. In one embodiment, the semiconductor memory 200 is Double Data Rate (DDR) memory, such as a Low Power Double Data Rate 5 (LPDDR5) memory. In accordance with various embodiments, the semiconductor device 200 may include a plurality of individual devices 202 that may be arranged on different semiconductor die. In some embodiments, the semiconductor device 10 of FIG. 1 may be used as the individual devices 202 of the semiconductor device 200. For ease of illustration, only the ZQ calibration circuits 204 of devices 202 are shown.

The semiconductor device 200 may include a package that contains and interconnects the various individual devices 202. The package may provide a plurality of external pins that couple to contact pads arranged on the interior of the package. The pins and pads may provide electrical connections such as between the devices 202 and the larger system to which the semiconductor device 200 is coupled. As shown in FIG. 2, the semiconductor device 200 may include an external resistance, which may be referred to as the RZQ 212. One or more of the individual calibration circuits 204 are coupled to the RZQ 212 and share the external resistance for impedance calibration. Each of calibration circuits 204 may be coupled to the RZQ 212 at a respective calibration terminal ZQ 27 (shown in FIG. 1.

The individual devices 202 may be configured as master devices or slave die. The devices 202 may have identical circuitry regardless of configuration as master or slave, but certain circuitry may be enabled or disabled based on the configuration. In some embodiments, such as the one shown in FIG. 2, the devices 202 may be configured by programming a state of a master signal ZQMaster in a mode register (not shown in FIG. 2) of the devices 202. In some embodiments, the mode register may be programmed based on commands provided by a memory controller 240. In other embodiments, the devices 202 may be configured by one or more fuses. The master device 202 may receive commands and/or other signals from the memory controller 240, The master device 202 may transmit commands and/or other signals to the slave devices 202 via conductive lines. The conductive lines between master and slave devices 202 may be referred to as backchannels. In the example shown in FIG. 2, the ZQ calibration circuit 204 of master device 202 may transmit signals to the ZQ calibration circuits 204 of slave devices via a backchannel clock signal line 206 and a backchannel enable signal line 208 for transmitting a backchannel clock signal and a backchannel enable signal, respectively.

In the example shown in FIG. 2, sixteen devices 202 share RZQ 212. However, it is understood that fewer or greater numbers of devices 202 may share RZQ 212 (e.g., 4, 8, 32). Furthermore, semiconductor device 200 may include more than one RZQ 212 in some embodiments. For example, master device 202 and slave device 1-7 may share RZQ 212 and slave device 8-15 may share a second external resistance RZQ (not shown). In this example, one of the slave device 8-15 may be configured as a master device. That is, in some examples, a device 202 may be configured as a master for each group of devices 202 sharing an external resistance.

Although not shown in FIG. 2, the devices 202 may include fuses that may be set to designate an order of the devices 202. That is, each device 202 may be configured as a certain device out of a number of devices. For example, the master device 202 may be configured as 1/16, and slave device 13 may be configured as 13/16. The fuses may configure counters or other circuitry within the devices 202 which may allow for arbitration between the devices 202. Continuing the previous example, master device 202 may execute a calibration command first and access RZQ 212. After receiving a calibration command from the master device 202, slave device 13 may count until a time after which the previous twelve devices have completed accessing the RZQ 212 before accessing the RZQ 212 as part of its execution of the calibration command. Other methods of arbitration may also be used, such as those disclosed in U.S. Patent Application Publication 2018/0167055, mentioned previously.

According to embodiments of the present disclosure, including those described with reference to FIGS. 1 and 2 and as will be described in more detail with reference to FIGS. 3-7, an apparatus may include a first device configured to receive a command mode signal, set a resting state of a clock signal based, at least in part, on a state of the command mode signal, and transition an enable signal to an active state. The resting state of the clock signal when the enable signal is transitioned to the active state may be indicative of the state of the command mode signal.

In some embodiments, the apparatus may include a second device configured to receive the clock signal and the enable signal from the first device. Responsive to the resting state of the clock when the enable signal is transitioned to the active state, the second device may be configured to execute a command in a mode associated with the state of the command mode signal. In some embodiments, the clock signal may be activated by the enable signal transitioning to the active state and the second device may be further configured to execute the command after the clock signal is activated. In some embodiments, the first device is configured to execute the command in the mode associated with the command mode signal and the second device may be configured to begin executing the command after the first device begins to execute the command. In some embodiments, first device may be configured to transition the enable signal to an inactive state after the second device has executed the command. In some embodiments, the clock signal and the enable signal are transmitted via a backchannel between the first device and the second device. In some embodiments, the second device includes a latch configured to receive the clock signal and the enable signal and latch the resting state of the clock when the enable signal is transitioned to the active state. In some embodiments, the command is a calibration command.

In some embodiments, the clock signal may have a first frequency or a second frequency responsive to the state of the command mode signal. In some embodiments, the first device may include a first oscillator configured to output a first signal at the first frequency, a divider logic circuit configured to receive the first signal and output a second signal at the second frequency, and a multiplexer configured to receive the first signal and the second signals as inputs and the command mode signal as a control signal. The multiplexer may be configured to output the first signal or the second signal as the clock signal based on the state of the command mode signal. In other embodiments, the first device may include a first oscillator configured to output a first signal at a first frequency and a second oscillator configured to output a second signal at a second frequency. The multiplexer may be configured to output the first signal or the second signal as the clock signal based on the state of the command mode signal.

Figure 3:
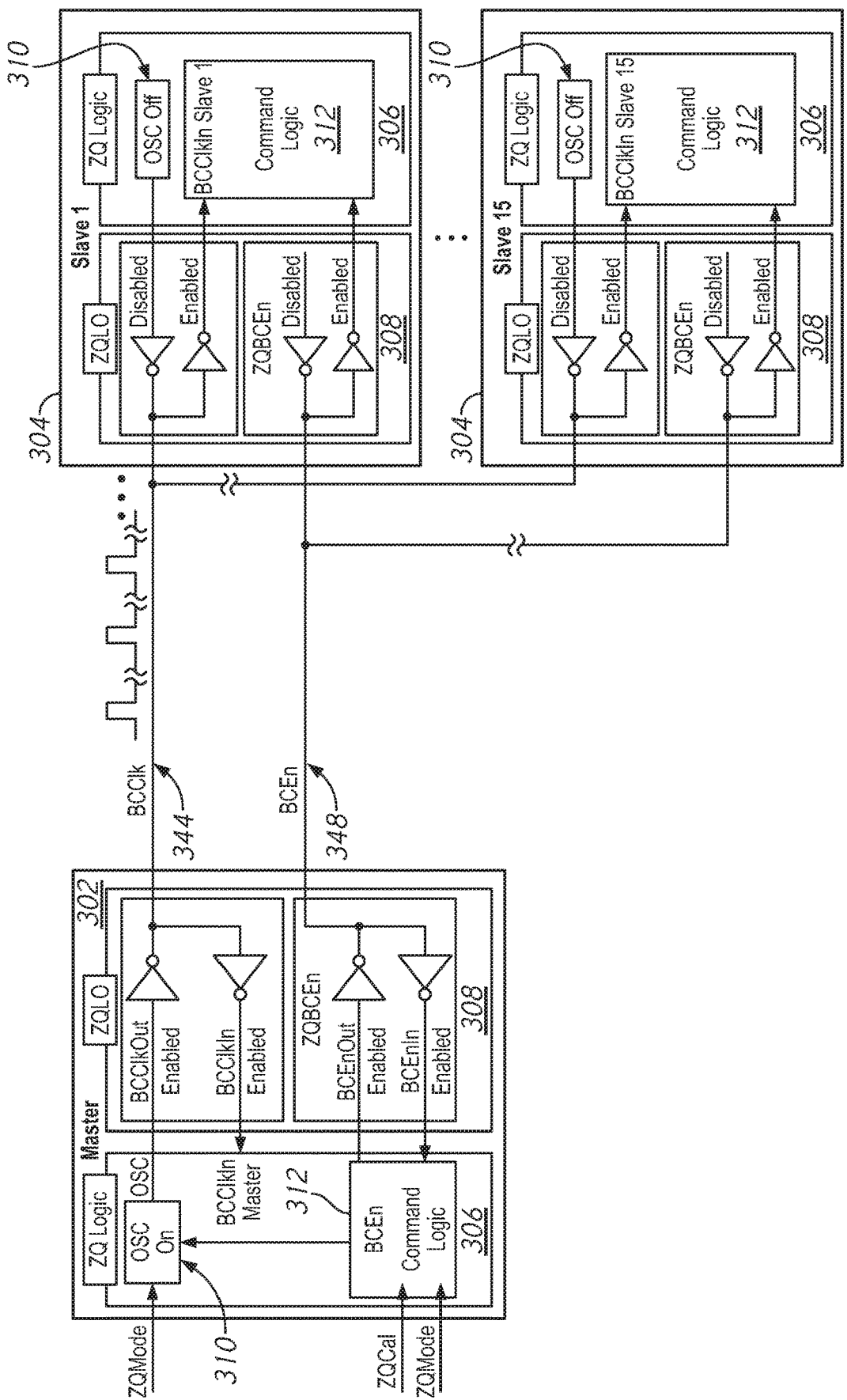
FIG. 3 is a block diagram of at least a portion of calibration circuits of master and slave devices according to an embodiment of the disclosure.

FIG. 3 is a block diagram of at least a portion of ZQ calibration circuits 302 of a master device (e.g., master calibration circuits) and calibration circuits 304 of slave devices (e.g., slave calibration circuits) according to an embodiment of the disclosure. The master device and slave devices may be located on individual die in some embodiments. The portion of ZQ calibration circuits 302 and 304 may be included in whole or in part in the ZQ calibration circuit 38 of FIG. 1 and/or in the ZQ calibration circuits 204 of FIG. 2 in some embodiments of the disclosure.

As shown in FIG. 3, both calibration circuits of the master device 302 and slave devices 304 include ZQ Logic blocks 306 and ZQIO buffers 308. The ZQ Logic blocks 306 include oscillators 310 and command logic blocks 312. However, certain elements of the ZQ Logic blocks 306 and ZQIO buffers 308 are disabled depending on the configuration of the devices. For example, all calibration circuits 302, 304 include oscillators 310, but the oscillators 310 of the slave calibration circuits 304 are disabled. In another example, the output buffers for the backchannel clock signal BCClk and back channel enable signal BCEn are disabled in calibration circuits 304. In the example shown in FIG. 3, the input buffers for the BCClk and BCEn signals are enabled for the master calibration circuits 302. The enabled input buffers may be used to maintain signal integrity (e.g., reduce phase errors). However, in other examples, the input buffers may be disabled in the master calibration circuits 302. As will be described in more detail, the command logic blocks 312 may include logic circuits which are selectively enabled or disabled depending on the master/slave configuration of the device.

As discussed previously with reference to FIG. 1, the ZQ calibration circuit of a master device may receive a ZQ_COM signal that includes a calibration command signal ZQCal and a command mode signal ZQMode associated with the calibration command. The ZQCal and ZQMode may be used by the command logic block 312 to execute the calibration command by the master devices. The execution of the calibration command by the master device may be in accordance with timing provided by the oscillator 310. The oscillator 310 may also provide timing for execution of calibration commands by the slave calibration circuits 304 by providing the backchannel clock signal BCClk on backchannel clock signal line 344.

In addition to being used to execute the calibration command in accordance with a particular operation mode on the master device, ZQMode may be used to set a resting state of the oscillator 310. When in a resting state, the oscillator 310 may not oscillate (e,g., may not generate a clock signal) and may maintain a constant signal (e.g., Osc=1 or Osc=0), for example, in the absence of a calibration command. In some embodiments, the ZQMode signal may be used to change a polarity of the resting state.

In addition to being used to initiate the execution of the calibration command on the master device, ZQCal may be used to transition a back channel enable signal BCEn to an active state (e.g., BCEn=1). The active BCEn may activate the oscillator 310 such that it begins to generate an oscillating clock signal (e.g., periodically switches between 1 and 0 states). Both the resting state and subsequent oscillating clock signal may be transmitted to the slave calibration circuits 304 via the backchannel clock signal BCClk on the backchannel clock signal line 344. The BCEn signal may also be transmitted to the slave calibration circuits 304 by backchannel signal BCEn on backchannel enable signal line 348.

The BCClk and BCEn signals may be received by the command logic block 312 of the slave calibration circuits 304. The active BCEn signal may be used by the slave calibration circuits 304 to generate a local calibration command, which may be executed by the slave calibration circuits 304. The execution of the calibration command may be performed by the slave calibration circuits 304 in accordance with timing provided by the BCClk signal. The command logic block 312 may further detect a resting state of the BCClk signal when BCEn transitions to the active state. The resting state of the BCClk signal at the transition of BCEn to the active state may be used to generate a local ZQMode signal, which may be used to execute the calibration command in accordance with a mode associated with the ZQMode signal by the slave calibration circuit 304.

As described herein, according to embodiments of the present disclosure, an apparatus may include a latch configured to receive a clock signal and an enable signal. The latch may be configured to latch a resting state of the clock signal when the enable signal is transitioned to an active state and output the resting state of the clock as a command mode. The apparatus may include a calibration circuit configured to receive the enable signal and the command mode and execute a calibration operation in a mode indicated by the command mode responsive to the enable signal transitioning to the active state. The calibration circuit may receive the clock signal and time execution of the calibration operation based on the clock signal. The apparatus is configured as a slave apparatus and the clock signal and enable signal are received from a master apparatus coupled to the slave apparatus.

Figure 4:
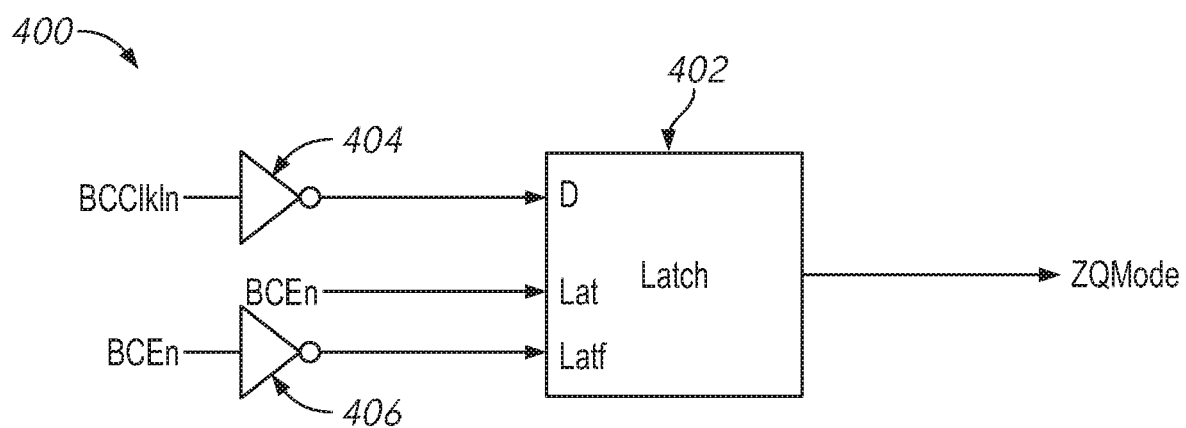
FIG. 4 is a circuit diagram of a circuit that may be used to detect a command mode according to an embodiment of the disclosure.

FIG. 4 is a block diagram of a circuit 400 that may be used to detect a command mode according to an embodiment of the disclosure. The circuit 400 may be included in command logic block (e.g., command logic block 312) of a calibration circuit in some embodiments. Circuit 400 may be enabled in devices configured as slave devices in some embodiments.

As shown in FIG. 4, circuit 400 includes a latch 402 and a first inverter 404 and a second inverter 406. An input of the first inverter 404 may receive a clock signal BCClkIn from a backchannel clock signal line. Clock signal BCClkIn may be associated with a clock signal BCClk generated and transmitted by a master device via the clock signal backchannel. The first inverter 404 may output an inverted state of BCClkIn to an input of the latch 402. An input of the second inverter 406 may receive an enable signal BCEn from a backchannel enable signal line. The enable signal may have been generated and transmitted by the master device via the backchannel enable signal line. The second inverter 406 may provide an inverted state of the BCEn signal to an input of the latch 402. An input of the latch 402 may receive an uninverted BCEn signal from the backchannel enable signal line. The latch 402 may be configured to latch an inverted state of BCClkIn when BCEn transitions to an active state (e.g., transitions from BCEn=0 to BCEn=1). The latched state of BCClkIn may be transmitted within the slave device as a local ZQMode signal. For example, when BCClkIn is high (e.g., BCClkIn=1) and BCEn transitions to the active state, ZQMode will be low (e.g., ZQMode=0). When BCClkIn is low (e.g., BCClkIn=0) and BCEn transitions to the active state, ZQMode will be high (e.g., ZQMode=1). Accordingly, a command mode of a calibration command may be transmitted by detecting a resting state of a clock signal when an enable signal is transitioned to an active state rather than providing a separate backchannel line for transmitting the command mode. In some embodiments, the local ZQMode signal may be used to initiate a self-adjustment of the calibration circuit. For example, the calibration circuit may adjust coupling of a low pass filter coupled to input nodes of a comparator in the calibration circuit and/or change logic to match the frequency of the clock and/or period of time for a calibration operation in response to a state of the ZQMode signal.

In some embodiments, the first inverter 404 may be omitted. In these embodiments, when BCClkIn is high (e.g., BCClkIn=1) and BCEn transitions to the active state, ZQMode will be high (e.g., ZQMode=1). When BCClkIn is low (e.g., BCClkIn=0) and BCEn transitions to the active state, ZQMode will be low (e.g., ZQMode=0).

Figure 5A:
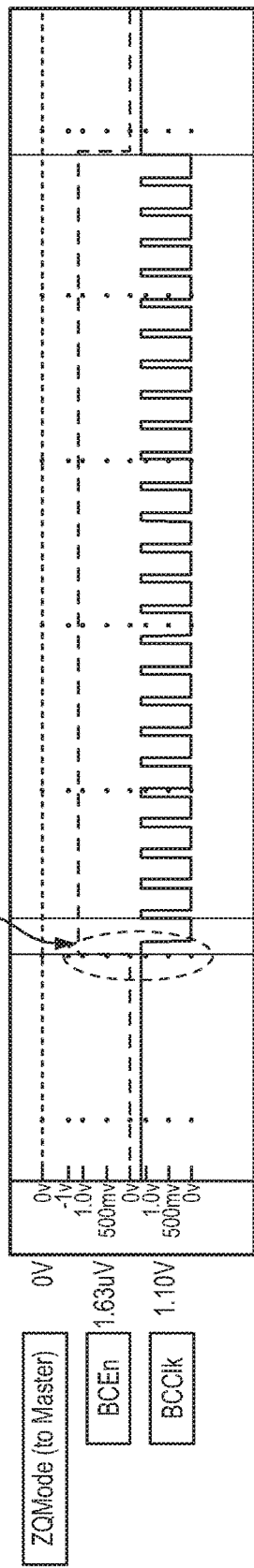
FIGS. 5A and 5B are timing diagrams for various signals during operation according to embodiments of the disclosure.
Figure 5B:
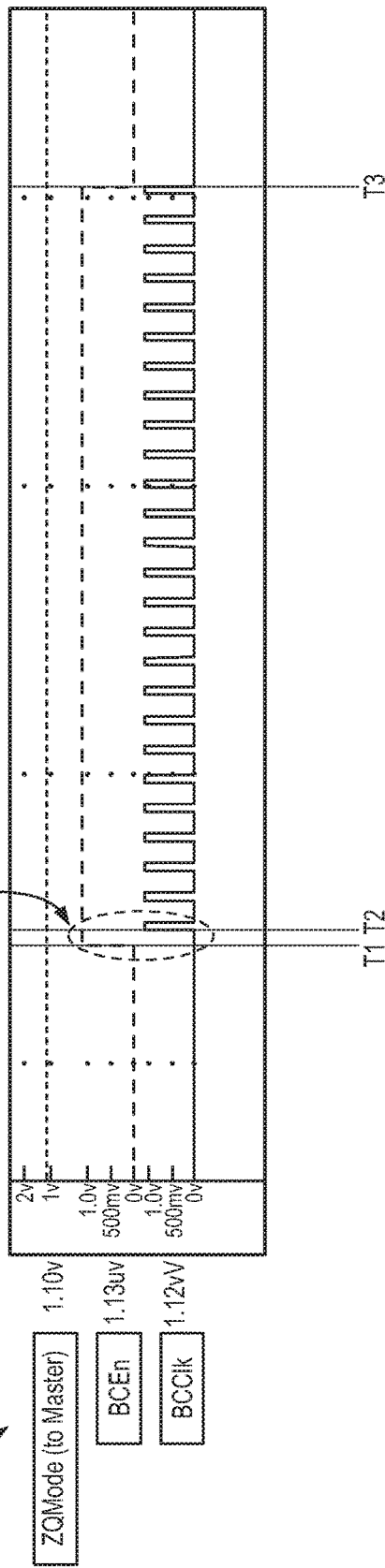

FIGS. 5A and 5B are timing diagrams 500A-500B of various signals during operation according to embodiments of the disclosure. A ZQ_COM signal may be received at a master device. The ZQ_COM signal may include a calibration command signal ZQCal and a command mode signal ZQMode. For simplicity, only ZQMode is shown in FIGS. 5A and 5B. FIG. 5A illustrates an example of transmitting a first command mode for a calibration command and FIG. 5B illustrates an example of transmitting a second command mode for the calibration command.

In the example shown in FIG. 5A, ZQMode is low (e.g., '0'). Thus, a resting state of a backchannel clock signal BCClk of the master device is set to high (e.g., '1') in response to ZQMode. In some devices, the default resting state of the backchannel clock signal may be high. That is, absent any ZQMode signal, the resting state of the backchannel clock signal may be high.

Still referring to FIG. 5A, responsive to the receipt of ZQ_COM, the master device may transition a backchannel enable signal BCEn around time T1 to an active state (e.g., high, '1'). As highlighted by circle 502, when BCEn transitions from low to high, the resting clock signal BCClk is high. This resting state may be latched by a slave device receiving the backchannel enable signal BCEn and backchannel clock signal BCClk from the master device. As discussed with reference to FIG. 4, the slave device may use the latched state of BCClk to generate a local ZQMode signal having a low state In this manner, a first command mode (e.g., background calibration) for a calibration command may be transmitted from the master device to the slave device.

The active backchannel enable signal BCEn may activate an oscillator generating the backchannel clock signal BCClk. The BCClk signal may begin to oscillate around time T2. In some examples, the time T2 may be a clock cycle after T1. In other examples, T2 may be two clock cycles after T1. The delay between times T1 and T2 may provide settling time for an internal ZQ reference voltage in some embodiments. In these embodiments, the ZQ reference voltage should be settled to a desired voltage prior to T2. The BCClk signal may continue to oscillate until BCEn is transitioned to an inactive state (e.g., low, '0') around time T3. The BCClk may return to its resting state, which is high in the example shown in FIG. 5A in response to the BCEn transitioning to an inactive state. The time T3 may be based, at least in part, on a time period required for all devices, including the master and all slave devices coupled to the master, to complete execution of the calibration command in the first command mode specified by ZQMode. The time may be based on the particular specification of the devices.

In the example shown in FIG. 5B, ZQMode is high (e.g., '1'). Thus, a resting state of a backchannel clock signal BCClk of the master device is set to low (e.g., '0') in response to ZQMode. Responsive to the receipt of ZQ_COM, the master device may transition a backchannel enable signal BCEn around time T1 to an active state (e.g., high, '1'). As highlighted by circle 504, when BCEn transitions from low to high, the resting clock signal BCClk is low. This resting state may be latched by a slave device receiving the backchannel enable signal BCEn and backchannel clock signal BCClk from the master device. As discussed with reference to FIG. 4, the slave device may use the latched state of BCClk to generate a local ZQMode signal having a high state. In this manner, a second command mode (e.g., command-based calibration) for a calibration command may be transmitted from the master device to the slave device.

The active backchannel enable signal BCEn may activate an oscillator generating the backchannel clock signal BCClk. The BCClk signal may begin to oscillate around time T2. The BCClk signal may continue to oscillate until BCEn is transitioned to an inactive state (e.g., low, '0') around time T3. The BCClk may return to its resting state, which is low in the example shown in FIG. 5B in response to the BCEn transitioning to an inactive state.

As discussed previously, commands may be executed in different manners depending on the command mode associated with the command. For example, for semiconductor device 10 in FIG. 1, a calibration command may be executed in background mode (ZQMode=0) or command-based mode (ZQMode=1). In some examples, background mode calibration commands may be executed at start-up of semiconductor device 10, reset of semiconductor device 10, and/or periodic intervals. Command-based mode calibration commands may be executed by a command issued by a component of semiconductor device 10 external to the calibration circuit 38 or a command issued by a device (e.g., memory controller) external to semiconductor device 10. In some examples, the clock period (e.g., clock frequency) of calibrations performed in background mode and command-based mode may be different.

Figure 6:
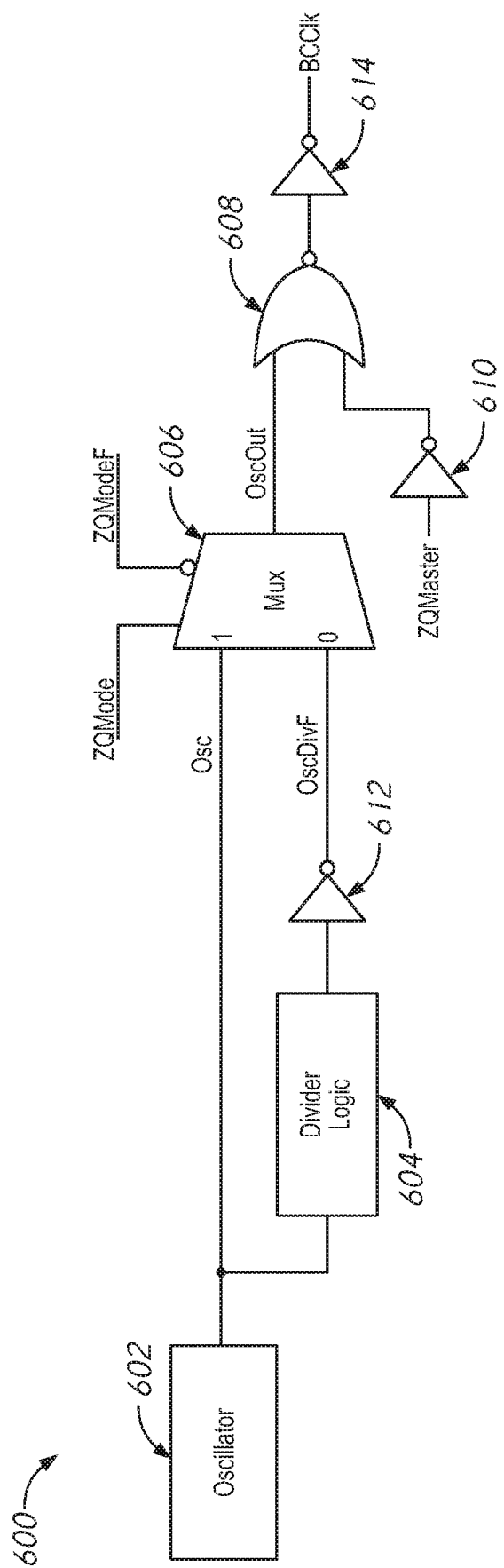
FIG. 6 is a block diagram of a circuit according to an embodiment of the disclosure.

FIG. 6 is a block diagram of a circuit 600 according to an embodiment of the disclosure. In some embodiments, circuit 600 may be included in ZQ logic blocks 306 shown in FIG. 3. Circuit 600 may include an oscillator 602. In some embodiments, oscillator 602 may be used to implement oscillator 310 shown in FIG. 3, The oscillator may output a signal Osc. In the embodiment shown in FIG. 6, circuit 600 may further include divider logic circuit 604, which may receive the oscillator signal Osc as an input and output a signal OscDivF which has a different period (e.g., longer period/lower frequency) compared to the oscillator signal Osc. In other embodiments, circuit 600 may include two oscillators configured to oscillate at different frequencies to output Osc and OscDivF. The two oscillator signals Osc and OscDivF may be provided as inputs to a mux 606. The mux 606 may be controlled by the command mode signal ZQMode. The command mode signal may determine which oscillator signal is used for timing execution of a calibration command. In the example shown in FIG. 6, when ZQMode=0 (e.g., background calibration), signal OscDivF is used to generate backchannel clock signal BCClk. When ZQMode=1 (e.g., command-based calibration), signal Osc is used to generate the BCClk signal. Thus, in addition to setting a resting state of the BCClk signal, ZQMode may be used to set a period or frequency of the BCClk signal.

In the example shown in FIG. 6, circuit 600 includes additional logic such as NOR gate 608 and inverter 610. NOR gate 608 may receive the output of the mux 606 OscOut and an output of the inverter 610 as inputs and output BCClk. The inverter 610 may receive the ZQMaster signal. The additional logic may control when the oscillator circuit 600 is enabled. As shown in FIG. 6, circuit 600 is enabled when ZQMaster is high (e.g., '1'). That is, when a device including circuit 600 is configured as a master device. In other examples, such as when a device is configured as master or slaves by fuses, the additional logic may be omitted from circuit 600.

In the example shown in FIG. 6, circuit 600 further includes inverter 612 between the divider logic circuit 604 and the mux 606 and an inverter 614 at the output of the NOR gate 608. However, inverter 612 and/or inverter 614 may be omitted in some embodiments, depending on a desired shape of the clock signal waveform.

Figure 7:
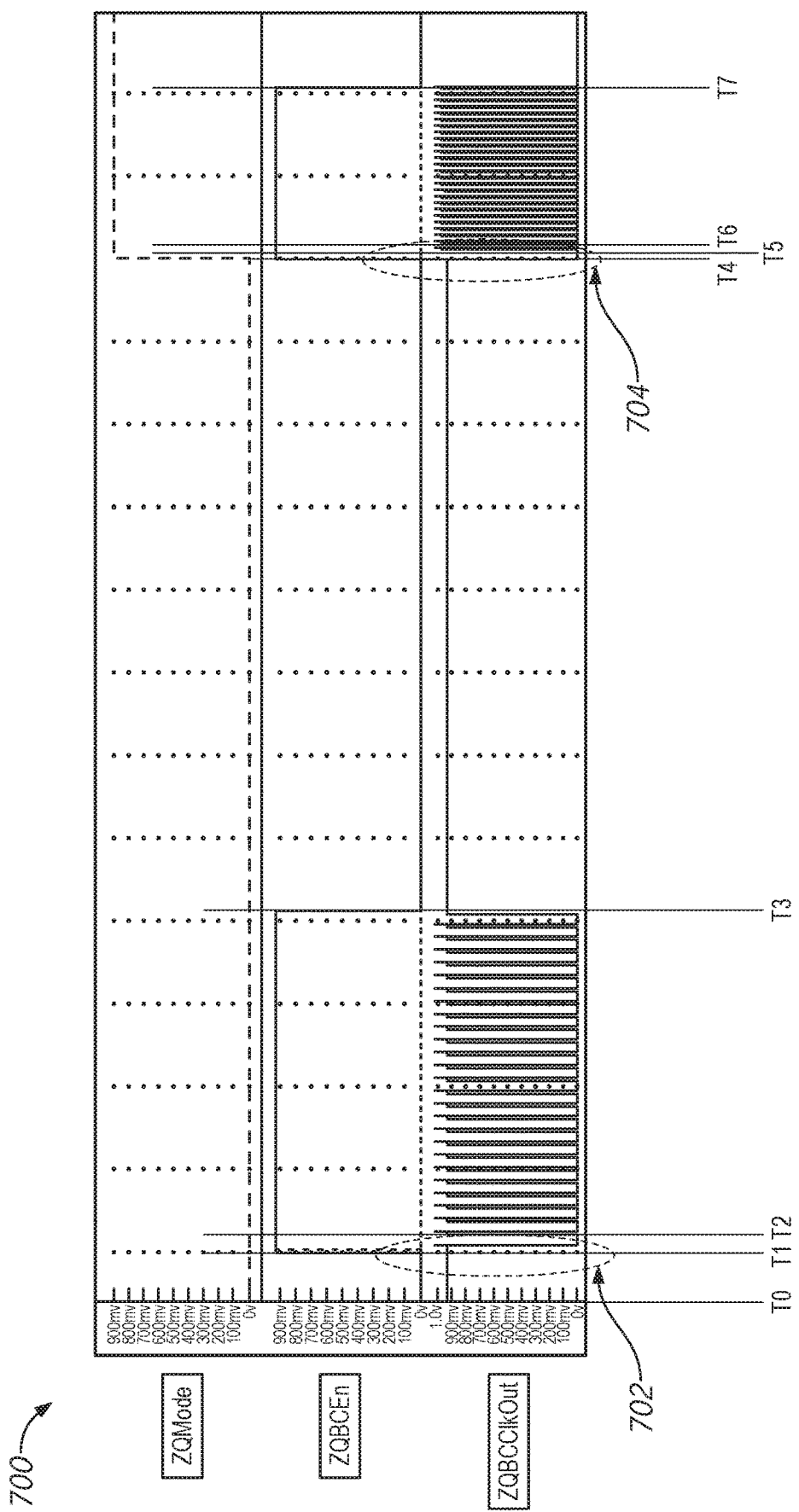
FIG. 7 is a timing diagram for various signals during operation according to an embodiment of the disclosure.

FIG. 7 is timing diagram 700 of various signals during operation according to an embodiment of the disclosure. Timing diagram 700 may illustrate signals when a master device includes circuit 600 shown in FIG. 6. A ZQ_COM signal may be received at a master device. The ZQ_COM signal may include a calibration command signal ZQCal and a command mode signal ZQMode. For simplicity, only ZQMode is shown in FIG. 7. At time T0, ZQMode is low (e.g., '0'), which may indicate a background calibration mode. Thus, a resting state of a backchannel clock signal BCClk of the master device is set to high (e.g., '1') in response to ZQMode.

Responsive to the receipt of ZQ_COM, the master device may transition a backchannel enable signal BCEn around time T1 to an active state (e.g., high, '1'). As highlighted by circle 702, when BCEn transitions from low to high, the resting clock signal BCClk is high. This resting state may be latched by a slave device receiving the backchannel enable signal BCEn and backchannel clock signal BCClk from the master device. As discussed with reference to FIG. 4, the slave device may use the latched state of BCClk to generate a local ZQMode signal having a low state (e.g., background calibration mode). The active backchannel enable signal BCEn may activate an oscillator generating the backchannel clock signal BCClk. The BCClk signal may begin to oscillate around time T2 at a frequency dictated by ZQMode as discussed in reference to FIG. 6. The BCClk signal may continue to oscillate until BCEn is transitioned to an inactive state (e.g., low, '0') around time T3. The BCClk may return to its resting state, which is high in the example shown in FIG. 7 in response to the BCEn transitioning to an inactive state. The time T3 may be based, at least in part, on a time period required for all devices, including the master and all slave devices coupled to the master, to complete execution of the calibration command in background calibration mode.

Later, around T4 a second ZQ_COM signal may be received with ZQMode in a high state (e.g., '1'), which may indicate a command-based calibration mode. Thus, a resting state of a backchannel clock signal BCClk of the master device is set to low (e.g., '0') in response to ZQMode. Responsive to the receipt of ZQ_COM, the master device may transition a backchannel enable signal BCEn around time T5 to an active state (e.g., high, '1'). As highlighted by circle 704, when BCEn transitions from low to high, the resting clock signal BCClk is low. This resting state may be latched by a slave device receiving the backchannel enable signal BCEn and backchannel clock signal BCClk from the master device. As discussed with reference to FIG. 4, the slave device may use the latched state of BCClk to generate a local ZQMode signal having a high state. The active backchannel enable signal BCEn may activate an oscillator generating the backchannel clock signal BCClk. The BCClk signal may begin to oscillate around time T6 at a frequency dictated by ZQMode. The BCClk signal may continue to oscillate until BCEn is transitioned to an inactive state (e.g., low, '0') around time T7. The BCClk may return to its resting state, which is low in the example shown in FIG. 7 in response to the BCEn transitioning to an inactive state.

In the example shown in FIG. 7, the frequency used for command-based calibration mode is higher than the frequency for background calibration mode. Thus, in this example, while calibration commands executed by the two different modes may require the same number of clock cycles, the total time required to execute calibration commands by the two different modes is different. In some applications, background calibration operations may provide for calibration coefficients with less noise. In some applications, command-based calibrations may provide for less lag time between calibration operations and execution of the next command.

Figure 8:
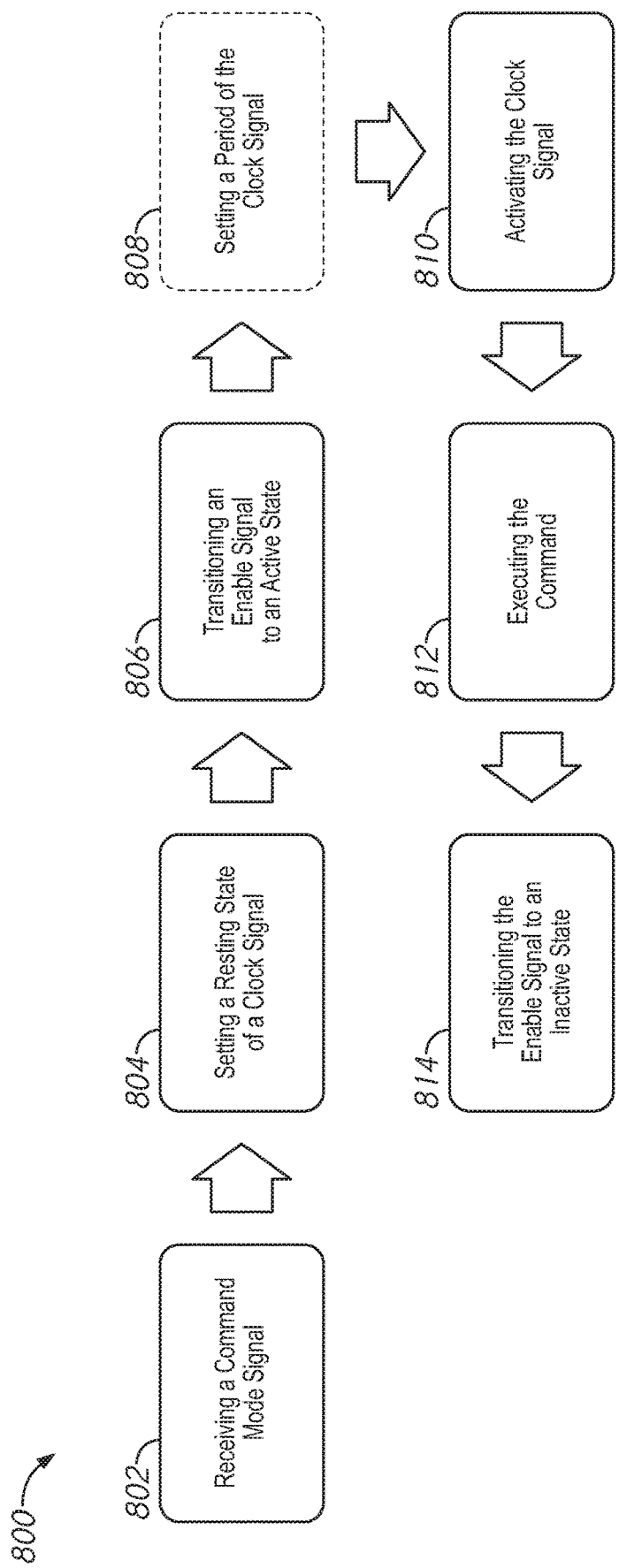
FIG. 8 is a flow chart of a method according to an embodiment of the disclosure.

FIG. 8 is a flow chart of a method 800 according to an embodiment of the disclosure. At block 802, a step of "receiving a command mode signal" may be performed. The command mode signal may be associated with a command. In some embodiments, the command mode signal may be received by a master device. At block 804, a step of "setting a resting state of a clock signal," may be performed. Block 804 may be performed responsive to receiving the command mode. The resting state of a clock signal may be set based, at least in part, on a state of the command mode signal in some embodiments. At block 806, a step of "transitioning an enable signal to an active state" may be performed. Block 806 may be performed responsive to receiving the command mode signal. The resting state of the clock signal when the enable signal is transitioned to the active state is indicative of the state of the command mode signal in some embodiments.

Optionally, in some embodiments, at block 808 the step of "setting a period of the clock signal," may be performed. Block 808 may be performed responsive to the command mode signal. The period may be based, at least in part, on the state of the command mode signal. At block 810, the step of "activating the clock signal" may be performed. In some embodiments, transitioning the enable signal to the active state may activate the clock signal.

In some embodiments, at block 812, a step of "executing the command" may be performed. The command may be executed in a mode associated with the command mode signal. In some embodiments, at block 814, the step of "transitioning the enable signal to an inactive state" may be performed after executing the command.

As described herein, apparatuses and methods for transmitting a command mode between components (e.g., master and slave components) using the resting state of a clock signal are disclosed. Transmitting the command mode with the resting state of the clock signal may allow the command mode to be transmitted without including a separate backchannel line for the command mode. This may reduce a number of conductive lines and/or layout space for a device in some applications.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
a first device configured to provide a clock signal and an enable signal; and
a plurality of second devices configured to receive the clock signal and the enable signal and to execute an operation responsive to an active state of the enable signal, wherein the operation is executed in a mode based, at least in part, on a resting state of the clock signal when the enable signal transitioned to the active state.

2. The apparatus of claim 1, wherein the plurality of second devices are further configured to execute the operation at different times.

3. The apparatus of claim 2, wherein the plurality of second devices are configured to execute the operation in a predetermined order.

4. The apparatus of claim 3, wherein the predetermined order is based, at least in part, on a plurality of fuses of the plurality of second devices.

5. The apparatus of claim 2, wherein each of the plurality of second devices comprises a mode register, wherein the predetermined order is based, at least in part, on a value written to the mode register.

6. The apparatus of claim 1, wherein each of the plurality of second devices comprises a counter, wherein each counter is configured to count to a different predetermined value, wherein the individual ones of the plurality of second devices are configured to execute the operation when the counter counts to the predetermined value.

7. The apparatus of claim 1, wherein the first device is configured to provide the clock signal and the enable signal based, at least in part, on a programming state of a mode register of the first device.

8. The apparatus of claim 7, further comprising a memory controller, wherein the memory controller is configured to set the programming state of the mode register.

9. An apparatus comprising:
a first device configured to receive a clock signal and an enable signal, wherein responsive to a state of the clock signal when the enable signal is transitioned to an active state, the first device is further configured to execute an operation in a mode associated with the state of the clock signal; and
a second device configured to receive the clock signal and the enable signal, wherein responsive to the state of the clock signal when the enable signal is transitioned to the active state, the second device is further configured to execute the operation in the mode associated with the state of the clock signal, wherein the first device and the second device are configured to execute the operation at different times and wherein the different times are based, at least in part, on a first counter of the first device and a second counter of the second device, wherein the first counter and the second counter are configured to count to different predetermined values.

10. The apparatus of claim 9, wherein the different predetermined values are based, at least in part, on fuses of the first memory device and the second memory device.

11. An apparatus comprising:
a first device configured to receive a clock signal and an enable signal, wherein responsive to a state of the clock signal when the enable signal is transitioned to an active state, the first device is further configured to execute an operation in a mode associated with the state of the clock signal;
a second device configured to receive the clock signal and the enable signal, wherein responsive to the state of the clock signal when the enable signal is transitioned to the active state, the second device is further configured to execute the operation in the mode associated with the state of the clock signal; and
an external resistance, wherein the first device and the second device are configured to access the external resistance at different times when the operation is a calibration operation.

12. A method comprising:
receiving a clock signal from a first memory device;
receiving an enable signal from a first memory device; and
executing an operation in a first mode when the clock signal is in a first state when the enable signal is received or in a second mode when the clock signal is in a second state when the enable signal is received.

13. The method of claim 12, wherein the clock signal and the enable signal are received by a plurality of memory devices and the operation is executed by the plurality of memory devices.

14. The method of claim 13, wherein the operation is executed by individual ones of the plurality of memory devices at different times.

15. The method of claim 13, further comprising programming mode registers of the plurality of memory devices to designate the different times when the operation is executed.

* * * * *